United States Patent
Flint (10) Patent No.: US 8,726,505 B2
(45) Date of Patent: *May 20, 2014

(54) HEAT SINKING METHODS FOR PERFORMANCE AND SCALABILITY

(75) Inventor: Terry Flint, Richmond, MN (US)

(73) Assignee: Revolution Lighting Technologies, Inc., Stamford, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 13/304,909

(22) Filed: Nov. 28, 2011

(65) Prior Publication Data

US 2013/0014925 A1    Jan. 17, 2013

Related U.S. Application Data

(63) Continuation of application No. PCT/US2011/043836, filed on Jul. 13, 2011.

(51) Int. Cl.
*B21D 53/02* (2006.01)
*B23P 19/02* (2006.01)
*F28F 7/02* (2006.01)

(52) U.S. Cl.
USPC ......... 29/890.03; 29/890.09; 29/411; 29/417; 29/469; 29/525; 165/168; 165/80.3; 165/80.4

(58) Field of Classification Search
USPC .............. 29/890–890.054, 890.09, 428, 469, 29/525, 411, 412, 417; 165/80.2–80.5, 165/168
See application file for complete search history.

(56) References Cited

U.S. PATENT DOCUMENTS

| | | | |
|---|---|---|---|
| 5,829,512 A * | 11/1998 | August | 165/46 |
| 7,204,298 B2 * | 4/2007 | Hodes et al. | 165/80.4 |
| 7,420,804 B2 * | 9/2008 | Leija et al. | 361/679.48 |
| 7,520,640 B1 * | 4/2009 | Shuai et al. | 362/294 |
| 7,723,730 B2 | 5/2010 | Groetsch et al. | |
| 7,744,257 B2 * | 6/2010 | Zhou et al. | 362/373 |
| 2005/0117293 A1 * | 6/2005 | Yokoyama | 361/688 |
| 2006/0082271 A1 * | 4/2006 | Lee et al. | 313/35 |
| 2008/0083527 A1 * | 4/2008 | Horng et al. | 165/80.3 |
| 2008/0093962 A1 | 4/2008 | Kim et al. | |
| 2009/0003003 A1 | 1/2009 | Park | |
| 2010/0132818 A1 * | 6/2010 | Dell et al. | 137/551 |
| 2010/0206538 A1 * | 8/2010 | Chen | 165/185 |

FOREIGN PATENT DOCUMENTS

| | | | | |
|---|---|---|---|---|
| JP | 2000206280 A * | 7/2000 | | G12B 15/06 |
| JP | 2002084029 A | 3/2002 | | |
| JP | 4638258 B2 | 12/2010 | | |

OTHER PUBLICATIONS

International Search Report of PCT/US2011/043836 filed Jul. 13, 2011.

* cited by examiner

*Primary Examiner* — Sarang Afzali
(74) *Attorney, Agent, or Firm* — Baker & Hostetler LLP (57) ABSTRACT

A technique and apparatus for heat dissipation in electrical devices is described. A bulk body may be configured with a plurality of radiating devices so that the bulk body may be divided into smaller bulk bodies to be used in conjunction with other electrical type assemblies to quickly and efficiently provide for a heat dissipation sub-assembly. In one aspect, the bulk bodies may be configured with internal voids such as a duct or tunnel interconnecting at least one input port and at least one output port for aiding in heat dissipation of an electrical device employing bulk body technique.

14 Claims, 10 Drawing Sheets

HEAT SINKING METHODS FOR
PERFORMANCE AND SCALABILITY

CROSS REFERENCE TO PRIOR APPLICATION

This application is a Continuation of International Application No. PCT/US2011/043836, filed on Jul. 13, 2011, and entitled IMPROVED HEAT SINKING METHODS FOR PERFORMANCE AND SCALABILITY, the entire contents of which are herein incorporated by reference in their entirety.

BACKGROUND

1. Field of the Invention

The invention is directed generally to an apparatus and method for improved heat sinking for performance and scalability and, more particularly, to an apparatus and method for improved heat sinking for performance and scalability in various electrical devices including LED devices to improve manufacturability and cost effective thermal management.

2. Related Art

Thermal management in electronic circuits has been dealt with in many different modes including fans, layout organization, orientation, heat conductors for components, and the like. The problem of removing heat from heat producing devices, or in some cases conveying heat into a device, continues to be an ongoing technological concern for multiple reasons including cost effectiveness. Off the shelf thermal management solutions are limited and still impose certain manufacturing constraints that in some design situations dictate less than optimum choices.

However, thermal generating applications may benefit from improved thermal management techniques that are more cost effective and that can handle situations that include high thermal capacity problems.

BRIEF DESCRIPTION OF THE DRAWINGS

The accompanying drawings, which are included to provide a further understanding of the invention, are incorporated in and constitute a part of this specification, illustrate embodiments of the invention, and together with the detailed description, serve to explain the principles of the invention. No attempt is made to show structural details of the invention in more detail than may be necessary for a fundamental understanding of the invention and the various ways in which it may be practiced. In the drawings.

DETAILED DESCRIPTION OF THE INVENTION

It is understood that the invention is not limited to the particular methodology, protocols, etc., described herein, as these may vary as the skilled artisan may recognize. It is also to be understood that the terminology used herein is used for the purpose of describing particular embodiments only, and is not intended to limit the scope of the invention. It is also to be noted that as used herein and in the appended claims, the singular forms "a," "an," and "the" include the plural reference unless the context clearly dictates otherwise. Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

Figure 1:
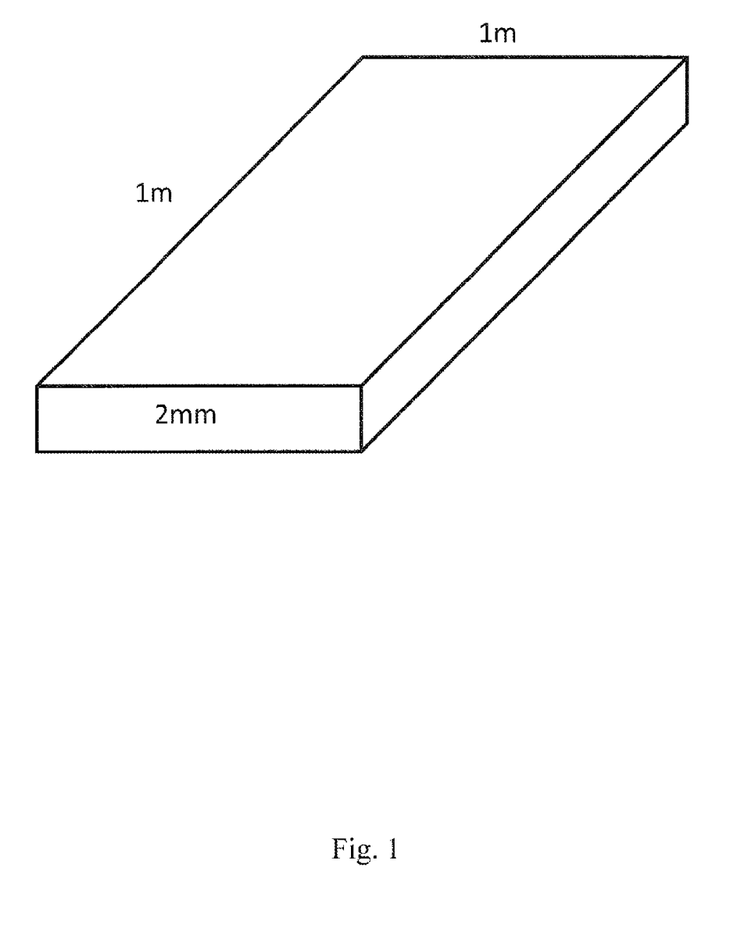
FIG. 1 illustrates an exemplary bulk body, according to principles of the invention.
Figure 2A:
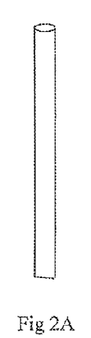
FIGS. 2A-2L illustrates exemplary embodiments of a radiating body, according to principles of the invention.
Figure 2B:
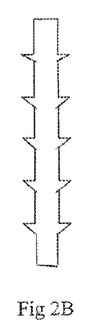
Figure 2C:
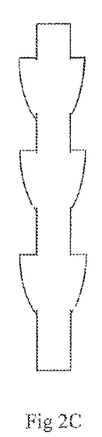
Figure 2D:
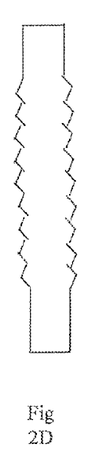
Figure 2E:
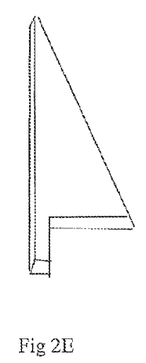
Figure 2F:
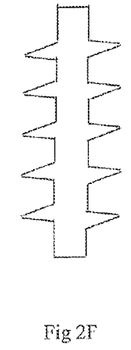
Figure 2G:
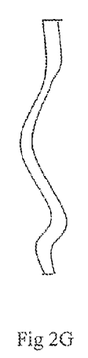
Figure 2H:
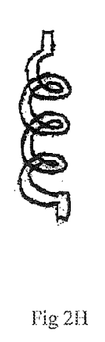
Figures 2I, 2J:
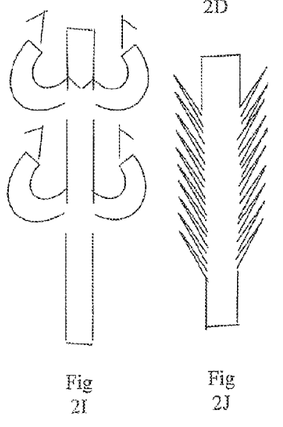
Figure 2K:
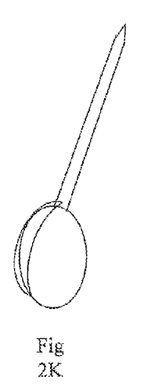
Figure 2L:
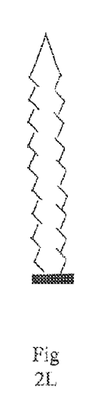

Scalable heat sink designs for manufacturability and mass production may be thought of in two parts, referred to herein as (a) bulk body and (b) radiating body. FIG. 1 illustrates an exemplary bulk body, constructed according to principles of the invention. A bulk body may be a solid or semi-solid mass of arbitrary size, thickness, geometry, material makeup configured to conduct heat out of or into a system or device. A bulk body may be an interface between a heat source or a heat sink. For purposes of illustration and example, consider an exemplary bulk body being about 2 mm thick and about one meter by one meter in size, comprising an exemplary material such as copper, as illustratively shown in FIG. 1.

FIGS. 2A-2L illustrates exemplary embodiments of a radiating body, according to principles of the invention. A radiating body may be an interface between a bulk body (such as in FIG. 1) and free air or other dissipative medium for releasing heat. A radiating body may comprise a thermally conductive or semi-conductive material with a mass (m) and surface area (a). Copper may be employed as an exemplary material for constructing a radiating body, but other suitable metals or material may be employed. A radiating body may employ one or more manufacturing techniques that have advantages over traditional radiation bodies including: stamping, rolling and crimping, each of which may create "surface area maximizing" geometries that are not attainable via more traditional manufacturing techniques such as casting, molding, etc.

The radiating body embodiments of FIGS. 2A to 2L also show different geometries with like masses but varying surface area. Geometries of interest are those whose surface areas are maximized for optimal radiation and convection of conducted heat.

Figure 3A:
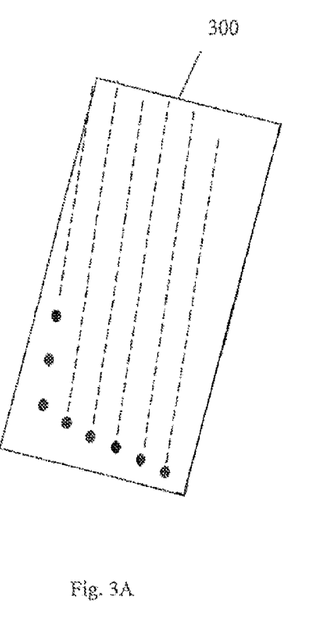
FIG. 3A illustrates a sheet bulk body, according to principles of the invention.
Figure 3B:
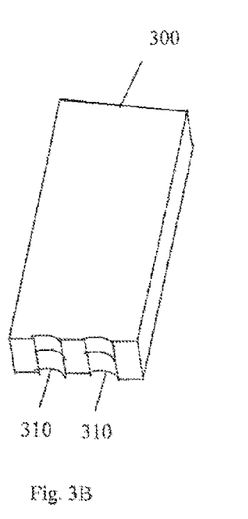
FIG. 3B illustrates a bulk body with through holes, according to principles of the invention.
Figure 3C:
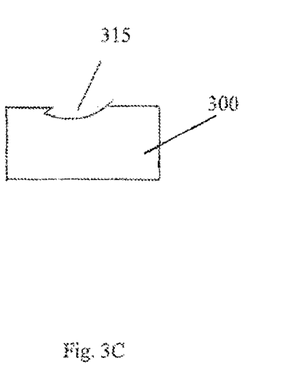
FIG. 3C illustrates a bulk body that is tamped with exemplary dimples, according to principles of the invention.
Figure 4A:
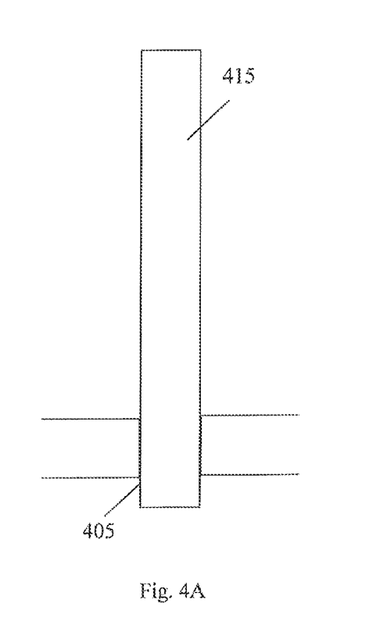
FIG. 4A illustrates a pressure fit arrangement employing a radiating body, according to principles of the invention.
Figure 4B:
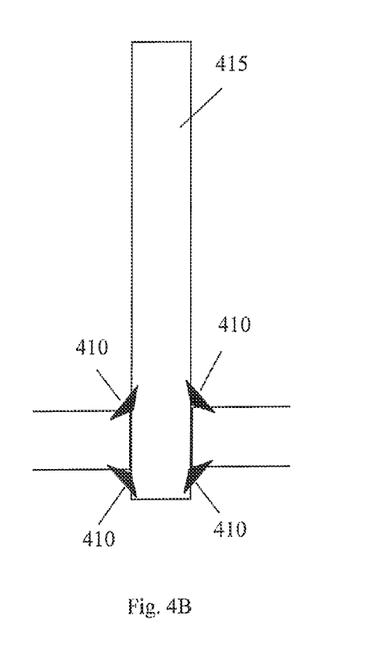
FIG. 4B illustrates a solder or fillet technique to affix a radiating body to a bulk body, according to principles of the invention.

A bulk body and radiating body may be joined together by the following exemplary process:

a) A full sheet 300 bulk body may be perforated, drilled, and/or stamped creating void areas such as thru-holes 310 and/or dimples 315 such as shown in relation to FIGS. 3A, 3B and 3C.

b) The void area may be configured to accommodate a pressure fit interface with each individual or single radiating body. FIG. 4A illustrates a pressure fit arrangement 405 employing a radiating body 415; however, any shaped radiating body may be substituted, such as those of FIGS. 2B-2L. FIG. 4B illustrates a solder or weld filet technique, denoted as reference numeral 410.

c) The interface between the bulk and radiating bodies may be joined together via solder or welding process or any technique of creating a reliable thermal interface.

d) Alternatively, the radiating body may be of a surface mount type that requires no hole or feature to connect, but only a solder or welding.

e) This assembly may be plated using traditional plating techniques. Anodizing the assembly may also create electrical neutrality.

f) The flat side of the bulk body may be machine finished and/or polished to a desired roughness. This forms a more ideal interface to a heat source.

Figure 5A:
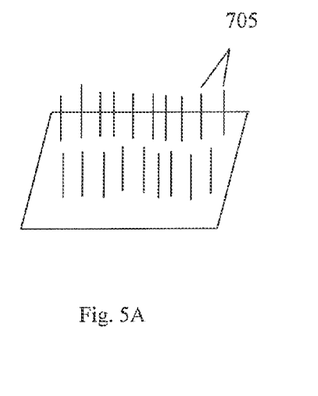
FIGS. 5A-5C illustrate some examples of heat sink raw material constructed according to principles of the invention.
Figure 5B:
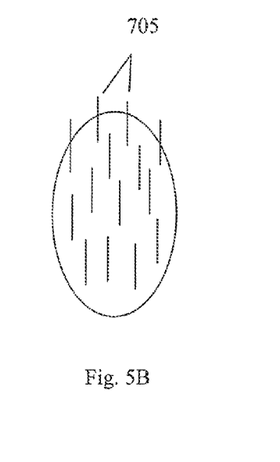
Figure 5C:
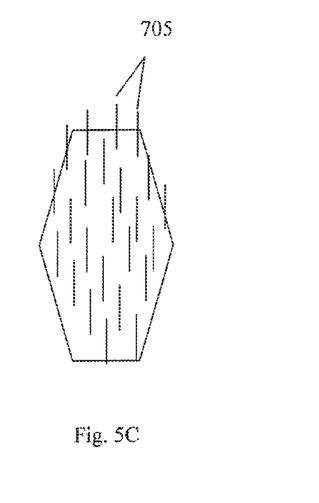

In one aspect, the exemplary 1 m×1 m bulk body when mated with radiating bodies 705 (such as those illustrated in reference to FIGS. 2A-2L) may be thought of as a single assembly, a heat sink raw material, or a stock quantity of heat sink that may be scored, routed, milled into smaller sub-parts of arbitrary size, shape, geometry. FIGS. 5A-5C illustrate some examples of heat sink raw material constructed according to principles of the invention, wherein a first bulk body may be further configured into individual parts, such as by routing, that may or may not be application specific.

Figure 6:
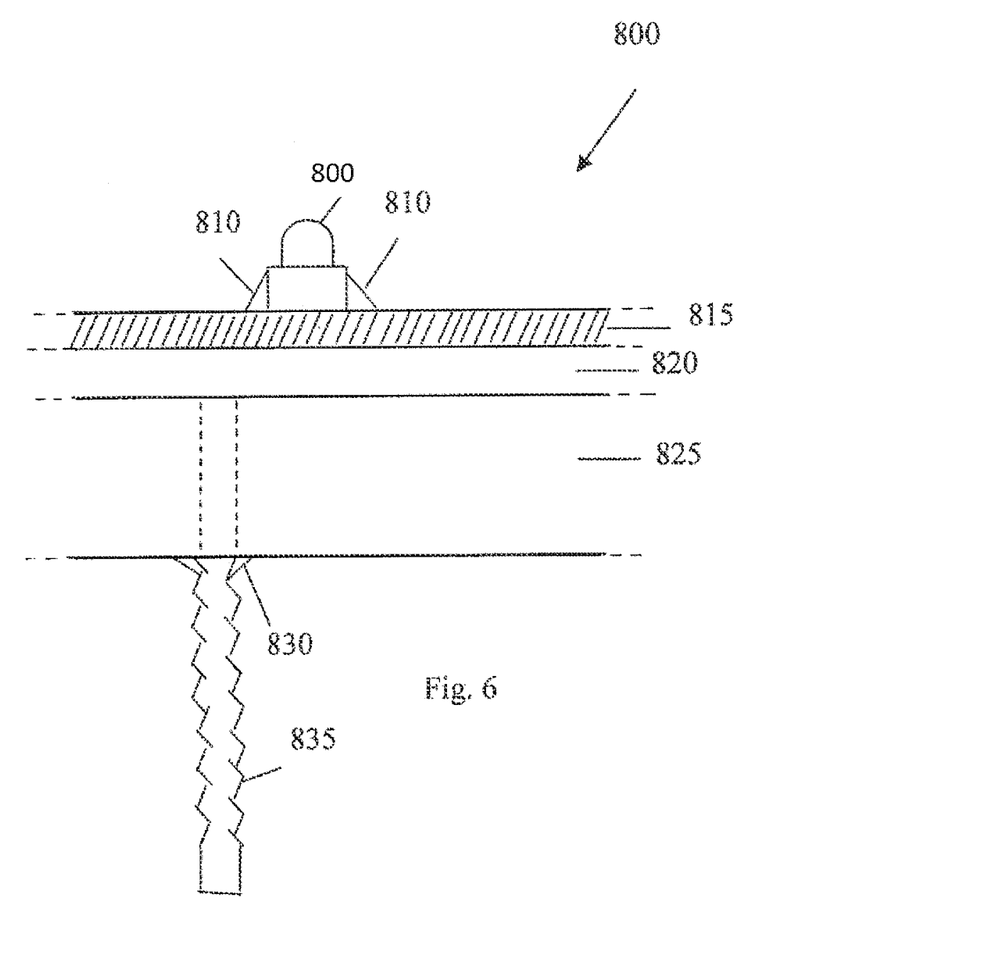
FIG. 6 illustrates an assembly, constructed according to principles of the invention.

One exemplary application, among many possible applications, of the heat sink components constructed according to principles of the invention may include light emitting diode (LED) lighting applications. For example, a section of the exemplary 1 m×1 m heat sink raw material may be milled to a desired size as illustrated in relation to FIG. 6. FIG. 6 illustrates an assembly constructed according to principles of the invention, generally denoted by reference numeral 800. The assembly 800 may include an LED package 805, perhaps a chip type, which may be bonded such as by solder filet 810 to a copper film 815. The copper film may be constructed adjacent to a thermally conductive dielectric 820. The thermally conductive dielectric 820 may be bonded adjacent a bulk body 825 in accordance with principles of the invention, as described previously. The bulk body 825 may be configured with a radiating body 835 such as, for example, one of the radiating bodies illustrated in relation to FIGS. 2A-2L. The LED package 805 may include one or more LEDs.

Figure 7A:
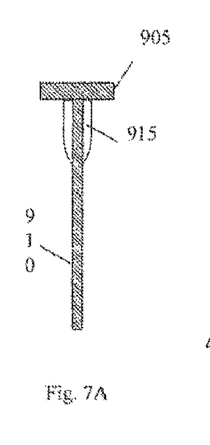
FIGS. 7A and 7B illustrate examples of an electrical conductor and dielectric insulator, constructed according to principles of the invention.
Figure 7B:
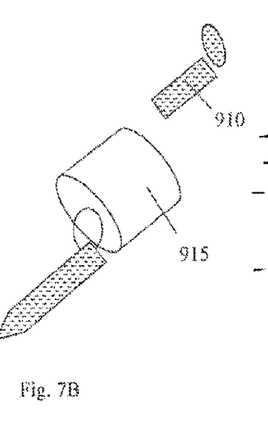
Figure 7C:
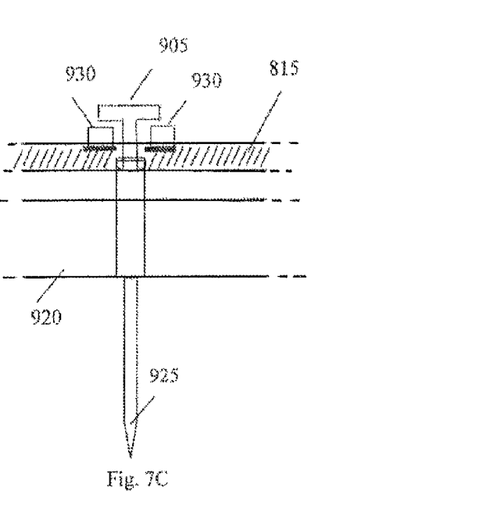
FIG. 7C illustrates the exemplary electrical conductor and dielectric of FIG. 7A in an electrical board assembly, configured according to principles of the invention.

Another optional feature of the assembly 800 may allow for electricity to pass through one or more holes in the heat sink section of FIG. 6. FIGS. 7A and 7B illustrate examples of an electrical conductor and dielectric insulator, constructed according to principles of the invention. FIG. 7C illustrates the exemplary electrical conductor and dielectric of FIG. 7A in an electrical board assembly. As shown in the example of FIGS. 7A and 7B, this feature may comprise an electrical conductor wire 905, pin 910, or other electrical conductor configured to transfer electrical energy from the radiating body side of the board to the LED side of the board, as shown in FIG. 7C. The addition of a section of dielectric material 915 to the electrical conductor 925 may isolate it from the bulk body 920. One end of the electrical conductor 925 may be connected to the copper film 815, perhaps by exposed contacts 930, to supply electrical energy to the one or more LEDs that may be present on the assembly 800. That is, the technique of FIG. 7A-7C may be utilized in conjunction with an assembly such as FIG. 6.

Alternatively, a radiating body may be used for transferring electrical energy from a regulating source through the bulk body and to the exposed electrically conducting solder pads as outlined in FIG. 6. The use of heat sink elements may eliminate the need for wires and hand soldering processes.

Active Cooling Duct

Figure 8A:
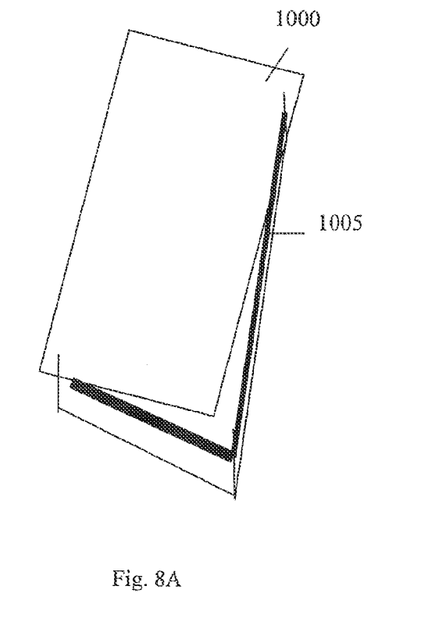
FIG. 8A is a perspective view that illustrates a bulk body with modifications, constructed according to principles of the invention.

FIG. 8A is a perspective view that illustrates a bulk body with modifications, according to principles of the invention, generally denoted as reference numeral 1001. In this embodiment, a void space 1005 may be constructed in the interior of the bulk body of arbitrary size, shape, and dimension. Substantially all of the interior of the bulk body may be void, or a subsection thereof.

Figure 8B:
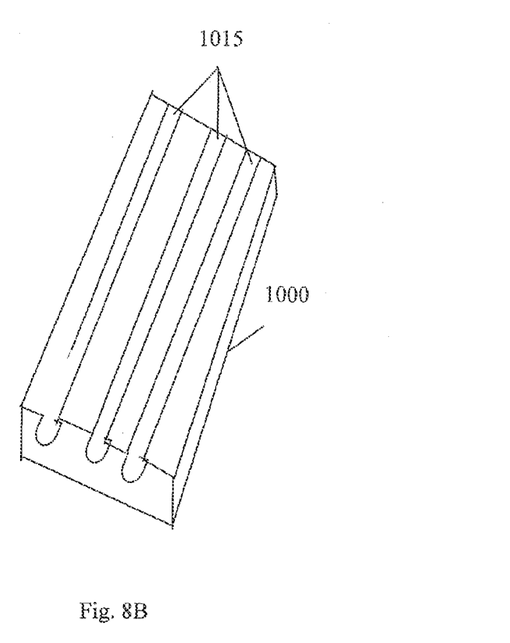
FIG. 8B is an exemplary cut-away portion of a bulk body along a lateral axis illustrating a void space, constructed according to principles of the invention.
Figure 8C:
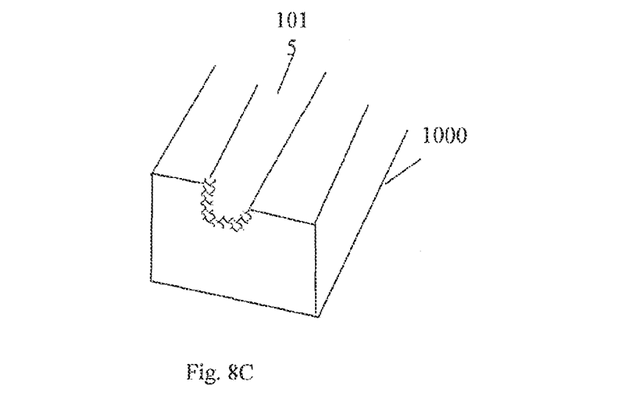
FIG. 8C is an exemplary cut-away portion of a bulk body along a lateral axis illustrating a wail having a rough surface, constructed according to principles of the invention.

FIG. 8B is an exemplary cut-away portion of a bulk body along a lateral axis illustrating a void space 1005 of the interior of a bulk body, which may comprise a duct or tunnel of arbitrary path and geometry. In FIG. 8B, the bulk body 1000 may be constructed by mating two separate bulk bodies (second portion is not shown, but essentially mirrors the portion of FIG. 8B) where one or both of them contain routed features where joining the two bodies create a completely encapsulated void space surrounded by a thermally conductive or semi-conductive material. The void space surface can be constructed such that the one or more wails 1015 are intentionally "not smooth," for maximizing the surface are of the bulk body-free air interface. A wail 1015 having a rough surface is shown in relation to FIG. 8C.

Figure 9:
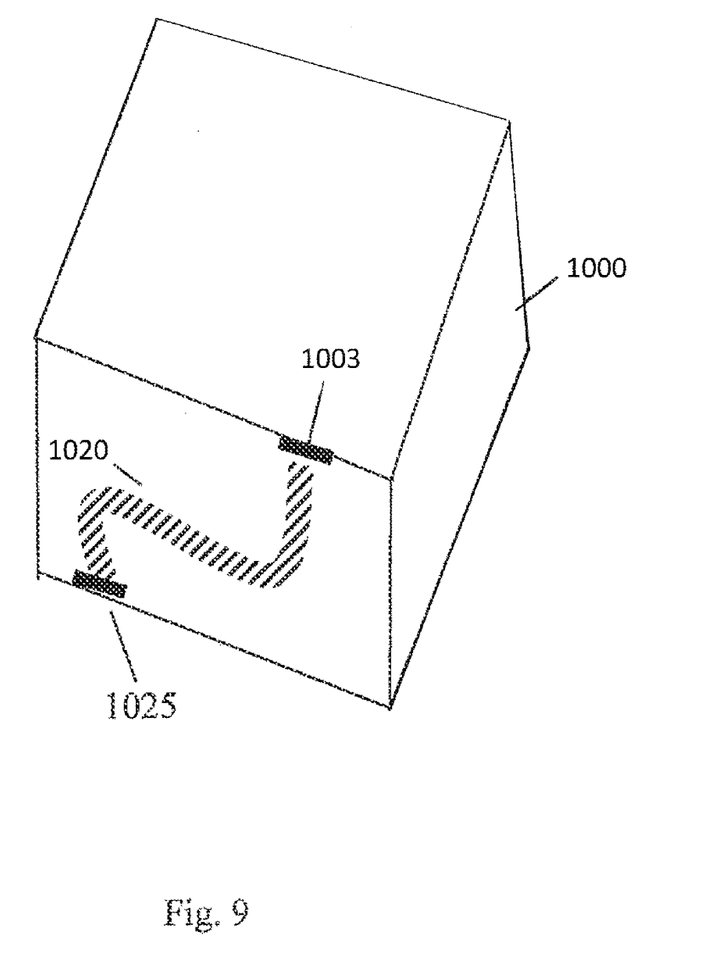
FIG. 9 is an embodiment of a bulk body, configured with void space therein having two ports or conduits to the surrounding environment, constructed according to principles of the invention.

FIG. 9 is an embodiment of a bulk body, configured with void space therein having two ports or conduits to the surrounding environment, constructed according to principles of the invention. There may be one, two or a multitude of ports 1025, 1030 interconnected by conduit 1020.

Figure 10:
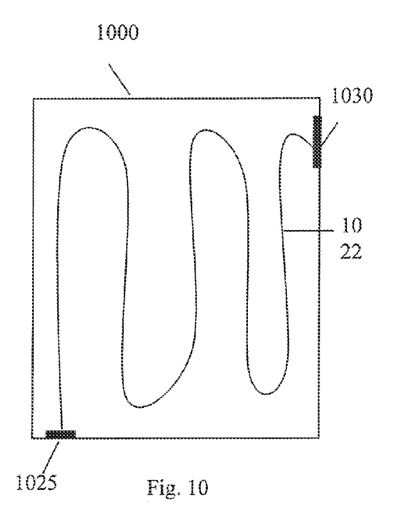
FIG. 10 is an embodiment of a bulk body, constructed according to principles of the invention.

FIG. 10 is an embodiment of a bulk body, constructed according to principles of the invention. The bulk body 1000 may be constructed with a single input port 1025 and a single output port 1030 with a tunnel 1022 created therebetween. The tunnel 1022 may be constructed similarly as a wail of FIG. 8B, i.e., by combining two portions of the bulk body.

Figure 11:
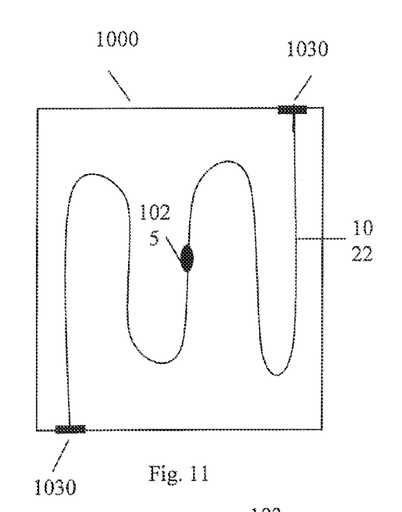
FIG. 11 is an embodiment of a bulk body, constructed according to principles of the invention.

FIG. 11 is an embodiment of a bulk body, constructed according to principles of the invention. The bulk body 1000 may be constructed with a single input port 1025 and multiple output ports 1030 with a tunnel 1022 created therebetween. The tunnel 1022 may be constructed similarly as a wail of FIG. 8B, i.e., by combining two portions of the bulk body.

Figure 12:
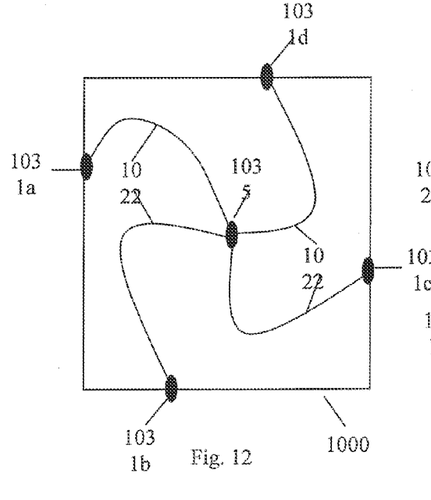
FIG. 12 is an embodiment of a bulk body, constructed according to principles of the invention.

FIG. 12 is an embodiment of a bulk body, constructed according to principles of the invention. The bulk body 1000 may be constructed with a multitude of input ports 1031a-1031d and a single output port 1035 with a tunnel 1022 created therebetween. The tunnel 1022 may be constructed similarly as a wail of FIG. 8B, i.e., by combining two portions of the bulk body.

Figure 13:
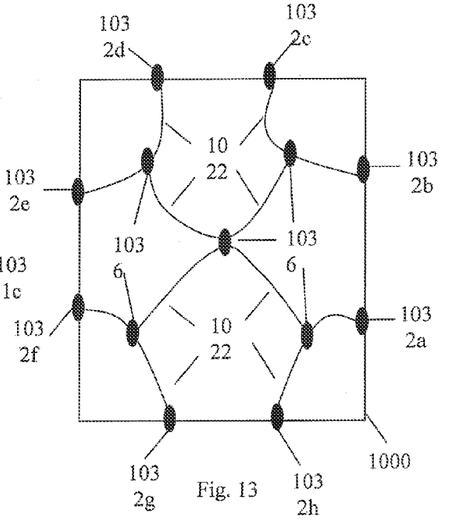
FIG. 13 is an embodiment of a bulk body, constructed according to principles of the invention.

FIG. 13 is an embodiment of a bulk body, constructed according to principles of the invention. The bulk body 1000 may be constructed with a multitude of input ports 1036 and a multitude of output port 1032a-1032h with a tunnel 1022 created therebetween. The tunnel 1022 may be constructed similarly as a wail of FIG. 8B, i.e., by combining two portions of the bulk body.

In any of the embodiments of FIGS. 9-13, a pressure source capable of moving air or any other fluid may be added, such as at each input. An example pressure source may be a piezoelectric fan such as obtainable from Nuventix of Austin, Tex.

In the embodiments of FIGS. 9-13, air (or cooling fluid) may enter each input port at an arbitrary flow rate and arbitrary pressure as to create moving air (or cooling fluid) through the duct or tunnel. The air may pass through the entire length of the duct or tunnel and out each output port. The air may be replaced by any fluid. The flow of the fluid may be made turbulent if desirable for heat transfer provided the pressure source and duct geometry are mutually supportive.

This technique provides an optimized path for heat to be extracted from a source or sink. Heat is conducted through the bulk body, radiated into the void which is the duct and evacuated out of the bulk body via convection into the ambient environment. Using the pressure source for generating fluid motion can have some other obvious advantages pertaining to airflow. One advantage is using the duct to introduce a venturi vacuum to pull additional air (or cooling fluid) into the duct/tunnel system. This may be accomplished by restricting airflow through one or more ducts so as to produce a pressure differential at one or more connected output ports.

The aforementioned technique of removing heat from a heat source may eliminate or reduce a need for a radiating body. Alternatively, this system of voids and ports may be used in conjunction with radiating bodies for added effectiveness. Modified radiating bodies may also include voids and ducts in a similar manner to the mentioned bulk body voids. These bodies may or may not encompass the same features as described in relation to FIG. 2A-2L in conjunction with voids, ducts and two or more input or output ports. The single output and single input radiating body may be realized by implementing a single tube or pipe.

Any combination of bulk body geometries, number of bulk body ports or lack thereof, bulk body port function (input or output), radiating bodies or lack thereof, radiating body geometries, radiating body ports or lack thereof, and function (input or output) may be employed.

Various modifications and variations of the described methods and systems of the invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described modes for carrying out the invention which are obvious to those skilled in the art are intended to be within the scope of the following claims.

What is claimed is:

1. A method of providing heat sinking, comprising the steps of:
constructing a bulk body having a substantially planar front surface and a substantially planar back surface;
modifying the planar front surface of the bulk body to include at least one of holes and dimples to accept a plurality of radiating bodies;
attaching the plurality of radiating bodies to the at least one of holes and dimples of the planar front surface of the bulk body;
partitioning the bulk body into multiple separate bulk bodies each having at least one of the plurality of radiating bodies; and
employing at least one of the multiple separate bulk bodies by attaching the planar back surface to an electrical device for thermal dissipation.

2. The method of claim 1, further comprising creating a void in the interior of the bulk body.

3. The method of claim 2, further comprising creating at least one input port and at least one output port in the bulk body, the at least one input port and the at least one output port interconnected by a tunnel.

4. The method of claim 3, further comprising providing a pressure source in the tunnel to create pressure to move a fluid through the tunnel for increasing heat dissipation.

5. The method of claim 1, wherein the electrical device includes a light emitting diode (LED) device.

6. The method of claim 1, wherein the plurality of radiating bodies are selected from among a group of radiating bodies having different shapes.

7. The method of claim 1, wherein the bulk body comprises the holes and the attaching step includes pressure fit insertion of the plurality of radiating bodies into the holes of the bulk body.

8. The method of claim 1, wherein the attaching step includes soldering the radiating bodies to the bulk body.

9. The method of claim 1, further comprising configuring at least one wail within the bulk body for increased heat dissipation.

10. The method of claim 1, wherein the partitioning the bulk body into multiple separate bulk bodies comprises milling the bulk body to form the multiple separate bulk bodies.

11. The method of claim 1, further comprising plating the bulk body.

12. The method of claim 1, further comprising plating the bulk body; and anodizing the bulk body to render the bulk body electrically neutral.

13. The method of claim 1, further comprising machining the planar back surface of the bulk body.

14. The method of claim 1, further comprising bonding the planar back surface to the electrical device.

* * * * *